US012796008B2

(12) United States Patent
Kwon et al.

(10) Patent No.: US 12,796,008 B2
(45) Date of Patent: Nov. 10, 2026

(54) SEMICONDUCTOR DEVICE INCLUDING TWO-DIMENSIONAL MATERIAL AND METHOD OF FABRICATING THE SAME

(71) Applicant: Samsung Electronics Co., Ltd., Suwon-si (KR)

(72) Inventors: Junyoung Kwon, Suwon-si (KR); Minsu Seol, Suwon-si (KR); Kyung-Eun Byun, Suwon-si (KR); Changseok Lee, Suwon-si (KR); Minseok Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 467 days.

(21) Appl. No.: 18/366,366

(22) Filed: Aug. 7, 2023

(65) Prior Publication Data

US 2024/0170562 A1 May 23, 2024

(30) Foreign Application Priority Data

Nov. 17, 2022 (KR) ........................ 10-2022-0154874

(51) Int. Cl.
*H10D 48/36* (2025.01)
*H10D 62/80* (2025.01)
*H10D 99/00* (2025.01)

(52) U.S. Cl.
CPC ........... *H10D 48/362* (2025.01); *H10D 62/80* (2025.01); *H10D 99/00* (2025.01)

(58) Field of Classification Search
CPC ..... H10D 30/47; H10D 48/362; H10D 62/882
See application file for complete search history.

(56) References Cited

U.S. PATENT DOCUMENTS

| | | | |
|---|---|---|---|
| 7,968,674 | B2 | 6/2011 | Choi et al. |
| 7,988,941 | B2 | 8/2011 | Choi et al. |
| 8,133,466 | B2 | 3/2012 | Shin et al. |
| 8,283,038 | B2 | 10/2012 | Choi et al. |
| 8,535,553 | B2 | 9/2013 | Kong et al. |
| 8,623,761 | B2 | 1/2014 | Bonilla et al. |
| 8,723,024 | B2 | 5/2014 | Choi et al. |

(Continued)

FOREIGN PATENT DOCUMENTS

| | | | |
|---|---|---|---|
| KR | 20060116540 | A | 11/2006 |
| KR | 20200080056 | A | 7/2020 |

(Continued)

OTHER PUBLICATIONS

Shin et al., "Graphene Via Contact Architecture for Vertical Integration of vdW Heterostructure Devices", Small, vol. 18, Issue 28, Jun. 19, 2022 (Year: 2022).*

(Continued)

*Primary Examiner* — Vincent Wall
(74) *Attorney, Agent, or Firm* — Harness, Dickey & Pierce, P.L.C.

(57) ABSTRACT

A semiconductor device may include a first two-dimensional (2D) material layer, a second 2D material layer, a first electrode, a second electrode, a third electrode, a first gate electrode. and a second gate electrode. A Fermi-level may be pinned on an interfacial surface between the first 2D material layer and the first electrode. The Fermi-level may be depinned on an interfacial surface between the second 2D material layer and the first electrode.

12 Claims, 11 Drawing Sheets

(56) References Cited

U.S. PATENT DOCUMENTS

| | | | |
|---|---|---|---|
| 8,895,433 | B2 | 11/2014 | Bonilla et al. |
| 8,906,787 | B2 | 12/2014 | Park et al. |
| 8,912,530 | B2 | 12/2014 | Yang et al. |
| 9,040,957 | B2 | 5/2015 | Lee et al. |
| 9,064,777 | B2 | 6/2015 | Heo et al. |
| 9,108,848 | B2 | 8/2015 | Woo et al. |
| 9,324,634 | B2 | 4/2016 | Bao et al. |
| 9,324,635 | B2 | 4/2016 | Bao et al. |
| 9,359,211 | B2 | 6/2016 | Woo et al. |
| 9,472,450 | B2 | 10/2016 | Bonilla et al. |
| 9,527,043 | B2 | 12/2016 | Choi et al. |
| 9,533,265 | B2 | 1/2017 | Choi et al. |
| 9,583,358 | B2 | 2/2017 | Kim et al. |
| 9,721,734 | B2 | 8/2017 | Ryu et al. |
| 10,325,987 | B2 | 6/2019 | Park et al. |
| 10,734,384 | B1 | 8/2020 | Li et al. |
| 2006/0267100 | A1 | 11/2006 | Noguchi et al. |
| 2011/0127471 | A1 | 6/2011 | Shin et al. |
| 2013/0059155 | A1 | 3/2013 | Choi et al. |
| 2014/0087191 | A1 | 3/2014 | Chua et al. |
| 2014/0197459 | A1 | 7/2014 | Kis et al. |
| 2015/0235959 | A1 | 8/2015 | Lee et al. |
| 2021/0020744 | A1 | 1/2021 | Duan et al. |
| 2021/0305372 | A1* | 9/2021 | Khaderbad .......... H10D 30/024 |
| 2022/0262903 | A1 | 8/2022 | Lee et al. |

FOREIGN PATENT DOCUMENTS

| | | | |
|---|---|---|---|
| KR | 20210138897 | A | 11/2021 |
| KR | 10-2022-0031600 | A | 3/2022 |
| WO | WO-2018009931 | A1 | 1/2018 |

OTHER PUBLICATIONS

Radisavljevic et al., "Single-Layer MoS2 Transistors", 2011, 6, 147-150 (Year: 2011).*

Sachid, A. et al., 'High-gain monolithic 3D CMOS inverter using layered semiconductors' *Applied Physics Letters*, vol. 111, Nov. 2017, pp. 222101-1 to 222101-5.

Shin, Y. et al., 'Graphene Via Contact Architecture for Vertical Integration of vdW Heterostructure Devices' *Small*, vol. 18, Issue 28, 2022.

Korean Office Action dated May 12, 2026 issued in corresponding Korean Patent Appln. No. 10-2022-0154874 (with English translation).

* cited by examiner

SEMICONDUCTOR DEVICE INCLUDING TWO-DIMENSIONAL MATERIAL AND METHOD OF FABRICATING THE SAME

CROSS-REFERENCE TO RELATED APPLICATIONS

This application is based on and claims priority under 35 U.S.C. § 119 to Korean Patent Application No. 10-2022-0154874, filed on Nov. 17, 2022 in the Korean Intellectual Property Office, the disclosure of which is incorporated by reference herein in its entirety.

BACKGROUND

1. Field

The disclosure relates to a semiconductor device including a two-dimensional (2D) material and a method of fabricating the same.

2. Description of the Related Art

Complementary metal oxide semiconductor (CMOS) devices are used to process digital signals and/or store data. For example, a CMOS transistor is used to implement a memory or a logic circuit such as a BiCMOS circuit implemented together with a high-frequency operating bipolar transistor, a CMOS-type static random access memory (SRAM) cell circuit, etc.

Meanwhile, with the trend toward light, thin, and small electronic products, there is demand for improving integration of CMOS semiconductor devices. Recently, as a way to miniaturize semiconductor devices, research using two-dimensional (2D) materials has been conducted. By virtue of their stable and superior properties even with a small thickness of about 1 nm or less, the 2D materials are in the limelight as materials capable of overcoming limitations of performance degradation due to size reduction of semiconductor devices.

SUMMARY

Provided is a two-dimensional (2D) material-based semiconductor device capable of forming different types of contacts with an identical metal.

Provided is an electronic device including a semiconductor device.

Provided is a method of fabricating a semiconductor device in which a fabricating process is simplified.

Additional aspects will be set forth in part in the description which follows and, in part, will be apparent from the description, or may be learned by practice of the presented embodiments of the disclosure.

According to an embodiment, a semiconductor device may include a first two-dimensional (2D) material layer including a first surface, a second 2D material layer including a second surface facing the first surface of the first 2D material layer, a first electrode electrically connected between a first end region on the first surface of the first 2D material layer and a first end region on the second surface of the second 2D material layer, a second electrode on a second end region on the first surface of the first 2D material layer, a first gate electrode and a second gate electrode between the first 2D material layer and the second 2D material layer, and a third electrode on a second end region on the second surface of the second 2D material layer. The first gate electrode and the second gate electrode may be between the first electrode and the second electrode. A Fermi-level may be pinned on an interfacial surface between the first 2D material layer and the first electrode. The Fermi-level may be depinned on an interfacial surface between the second 2D material layer and the first electrode.

In some embodiments, the interfacial surface between the first 2D material layer and the first electrode may include a contact of an n-type polarity, and the interfacial surface may be between the second 2D material layer and the first electrode may include a contact of a p-type polarity.

In some embodiments, the first 2D material layer may include $MoS_2$ or $WS_2$.

In some embodiments, the second 2D material layer may include $WSe_2$.

In some embodiments, the first 2D material layer and the second 2D material layer may include $MoTe_2$.

In some embodiments, the semiconductor device may further include a first insulating layer on the first 2D material layer and a second insulating layer on the second gate electrode.

In some embodiments, the semiconductor device may further include an intermediate layer between the first electrode and the second 2D material layer.

In some embodiments, the intermediate layer may include amorphous carbon, graphene, or hexagonal boron nitride (h-BN).

In some embodiments, a thickness of the intermediate layer may be less than or equal to about 1 nm.

In some embodiments, the semiconductor device may further include a third insulating layer on the second 2D material layer, a third gate electrode on the third insulating layer, a fourth insulating layer under the first 2D material layer, and a fourth gate electrode under the fourth insulating layer.

In some embodiments, the first electrode, the second electrode, and the third electrode may include an identical material.

In some embodiments, the first electrode may include a source electrode, and the second electrode and the third electrode each may include drain electrode.

According to an embodiment, an electronic device may include any one of the above-described semiconductor devices.

According to an example embodiment, a method of fabricating a semiconductor device may include forming a first two-dimensional (2D) material layer; forming a first electrode and a second electrode on a first end region of the first 2D material layer and a second end region of the second 2D material layer, respectively; forming a first insulating layer on the first 2D material layer, the first electrode, and the second electrode; etching a portion of the first insulating layer to provide an etch first insulating layer; forming a first gate electrode and a second gate electrode on the etched first insulating layer; forming a second insulating layer on the second gate electrode; forming a third electrode on the second insulating layer; forming a second 2D material layer on the first electrode and the third electrode; and forming a third insulating layer on the second 2D material layer. A Fermi-level may be pinned on an interfacial surface between the first 2D material layer and the first electrode. The Fermi-level may be depinned on an interfacial surface between the second 2D material layer and the first electrode.

In some embodiments, the forming the second 2D material layer may include forming the second 2D material layer by transferring the second 2D material onto the first electrode.

In some embodiments, the forming the first electrode may include forming the first electrode on the first 2D material layer by depositing the first electrode on the first 2D material using physical vapor deposition (PVD).

In some embodiments, the method may further include forming an intermediate layer on the first electrode.

In some embodiments, the forming the second 2D material layer may include directly growing the second 2D material layer on the intermediate layer.

In some embodiments, the method may further include forming a third gate electrode on the third insulating layer.

In some embodiments, the method may further include forming a fourth gate electrode under the first 2D material layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
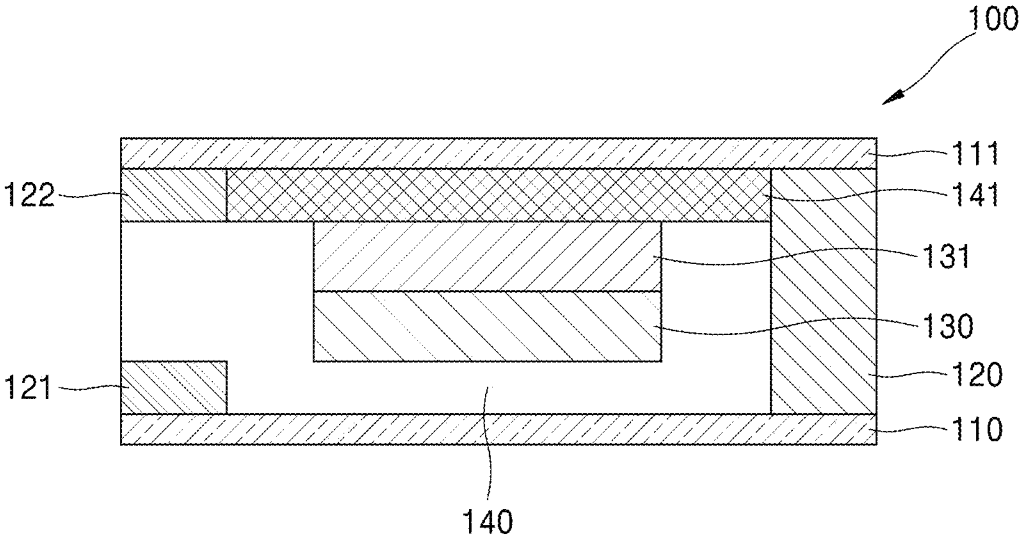
FIGS. 1 to 4 are cross-sectional views of a semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinbelow, with reference to the accompanying drawings, a semiconductor device including a two-dimensional (2D) material and a method of fabricating the same will be described in detail. In the drawings, like reference numerals denote like components, and sizes of components in the drawings may be exaggerated for convenience of explanation. In addition, embodiments to be described are merely examples, and various modifications may be made from such embodiments.

An expression such as "above" or "on" may include not only the meaning of "immediately on in a contact manner", but also the meaning of "on in a non-contact manner". Singular forms include plural forms unless apparently indicated otherwise contextually. When a portion is referred to as "comprising" a component, the portion does not exclude other components but may further include another component unless stated otherwise.

The use of the terms of "the above-described" and similar indicative terms may correspond to both the singular forms and the plural forms. When there is an explicit description of the order of operations of the method or there is no description contrary thereto, these operations may be performed in an appropriate order and the order is not necessarily limited to the described order.

Connections of lines or connection members between components shown in the drawings are illustrative of functional connections and/or physical or circuit connections, and in practice, may be represented as alternative or additional various functional connections, physical connections, or circuit connections.

The use of all examples or example terms is only to describe technical concepts in detail, and the scope is not limited by these examples or terms unless limited by the claims.

FIG. 1 is a cross-sectional view showing a semiconductor device according to an embodiment.

Referring to FIG. 1, a semiconductor device 100 may include a first two-dimensional (2D) material layer 110, a first electrode 120 arranged on a right side of the first 2D material layer 110, a second electrode 121 arranged on a left side of the first 2D material layer 110, a first insulating layer 140 arranged on the first 2D material layer 110, a first gate electrode 130 and a second gate electrode 131 arranged on the first 2D material layer 110 between the first electrode 120 and the second electrode 121, a second insulating layer 141 arranged on the second gate electrode 131, a third electrode 122 arranged on the second electrode 121, and a second 2D material layer 111 arranged on the first electrode 120 and the third electrode 122.

The first electrode 120 may be electrically connected to the first 2D material layer 110 and the second 2D material layer 111. The second electrode 121 may be arranged on a top surface of the first 2D material layer 110 and may be electrically connected to the first 2D material layer 110. The third electrode 122 may be arranged on a bottom surface of the second 2D material layer 111 and may be electrically connected to the second 2D material layer 111. The first insulating layer 140 may be filled between the first 2D material layer 110 and the first gate electrode 130 and may be filled between the second electrode 121 and the third electrode 122. The second insulating layer 141 may be filled between the second gate electrode 131 and the second 2D material layer 111.

The first 2D material layer 110 may have a first surface, and the second 2D material layer 111 may have a second surface facing the first surface of the first 2D material layer 110. The first electrode 120 may be electrically connected between a first edge (e.g., end region) on the first surface of the first 2D material layer 110 and a first edge (e.g., end region) on the second surface of the second 2D material layer 111.

The second electrode 121 may be arranged on a second edge (e.g., end region) on the first surface of the first 2D material layer 110. The first gate electrode 130 and the second gate electrode 131 may be arranged between the first 2D material layer 110 and the second 2D material layer 111 and between the first electrode 120 and the second electrode 121. The third electrode 122 may be arranged on a second edge (e.g., end region) on the second surface of the second 2D material layer 111.

The semiconductor device 100 shown in FIG. 1 may be a complementary metal oxide semiconductor (CMOS) inverter. The CMOS inverter may have a structure in which gates of an N-channel MOS field effect transistor (NMOSFET) and a P-channel MOSFET are connected to receive an input voltage Vin and drains of the NMOSFET and the PMOSFET are connected to output an output voltage Vout.

The first 2D material layer 110 and the second 2D material layer 111 may include a 2D semiconductor material having a polycrystal structure. A 2D semiconductor material may mean a 2D material having a layered structure in which constituent atoms are two-dimensionally coupled. The 2D semiconductor material may have an electrical property and maintain high mobility without a large change in characteristics thereof even when the thickness thereof decreases to a nanoscale.

The 2D semiconductor material may include a material having a band gap of about 0.5 eV to about 3.0 eV. For example, the 2D semiconductor material may include transition metal dichalcogenide (TMD) or black phosphorus. However, the disclosure is not limited thereto. TMD, which is a 2D material having semiconductor characteristics, may be a compound of a transition metal and a chalcogen element. Herein, the transition metal may include at least one of, for example, Mo, W, Nb, V, Ta, Ti, Zr, Hf, Co, Tc, and Re, and the chalcogen element may include at least one of, for example, S, Se, and Te. As a detailed example, TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and so forth. However, the present disclosure is not limited thereto. Black phosphorus may be a semiconductor material having a structure in which phosphorus (P) atoms are two-dimensionally coupled.

The first 2D material layer 110 may include a material that easily has n-type polarity, and in this case, the second 2D material layer 111 may include a material that easily has a p-type polarity. For example, the first 2D material layer 110 may include $MoS_2$ or $WS_2$ and the second 2D material layer 111 may include $WSe_2$. However, without being limited thereto, the first 2D material layer 110 may include a material that easily has a p-type polarity. In this case, the second 2D material 111 may include a material that easily has an n-type polarity.

In another embodiment, the first 2D material layer 110 and the second 2D material layer 111 may include the same material. The first 2D material layer 110 and the second 2D material layer 111 may include the same ambipolar material. For example, the first 2D material layer 110 and the second 2D material layer 111 may include $MoTe_2$. The first 2D material layer 110 and the second 2D material layer 111 may include the same ambipolar material, and polarities thereof may be adjusted by changing a contact with the first electrode 120.

An interfacial surface between the first 2D material layer 110 and the first electrode 120 may be subject to Fermi-level pinning, and an interfacial surface between the second 2D material layer 111 and the first electrode 120 may be subject to Fermi-level depinning.

The first 2D material layer 110 may be subject to Fermi-level pinning by a defect occurring in a process of depositing the first electrode 120 on an upper portion thereof. The first 2D material layer 110 may be subject to Fermi-level pinning by a defect regardless of a type of a material of the first electrode 120, and a point at which a Fermi level is pinned may be determined by adjusting the defect.

The second 2D material layer 111 may be formed by a transfer process on the first electrode 120, and may be in physical contact with the first electrode 120. TMD constituting the second 2D material layer 111 may maintain an atomic structure, and may be coupled with metal constituting the first electrode 120 by a van der Waals force. A distance between the TMD constituting the second 2D material layer 111 and the metal constituting the first electrode 120 may be about a van der Waals gap (about 0.3 nm). A density of state (DoS) may not be formed in a band gap due to the van der Waals gap, such that a Fermi level may be depinned.

On the interfacial surface between the second 2D material layer 111 and the first electrode 120 where the Fermi level is depinned, when metal having a high work function is used as the first electrode 120, the Fermi level may be aligned near a valence band, making a contact of a p-type polarity. On the other hand, on the interfacial surface between the first 2D material layer 110 and the first electrode 120 where the Fermi level is pinned, a defect state occurs near a conduction band, such that even when metal having a high work function is used as the first electrode 120, the Fermi level is pinned near the conduction band and thus a contact of an n-type polarity may be formed. Consequently, different types of contacts may be formed with the same single first electrode 120 and a stacked CMOS structure may be easily manufactured without a complex wiring structure.

The first 2D material layer 110 and the second 2D material layer 111 may serve as a channel. A semiconductor device including the first 2D material layer 110 and the second 2D material layer 111 may have superior performance even with a small thickness of about 1 nm or less, and also reduce a short channel effect.

The first electrode 120, the second electrode 121, and the third electrode 122 may include the same material. The first electrode 120, the second electrode 121, and the third electrode 122 may include a metal material having a superior electricity conductivity like Ag, Au, Pt, Cu, etc., without being limited thereto. By forming the first electrode 120, the second electrode 121, and the third electrode 122 with the same material, a manufacturing process may be simplified.

The first 2D material layer 110, the first gate electrode 130, the first electrode 120, and the second electrode 121 may form a first transistor. The first transistor may be of an N-type transistor, without being limited thereto.

The second 2D material layer 111, the second gate electrode 131, the first electrode 120, and the third electrode 122 may form a second transistor. When the first transistor is an N-type transistor, the second transistor may be a P-type transistor.

An input signal may be input to the first gate electrode 130 and the second gate electrode 131, and an output may be generated through the first electrode 120. In this case, the first gate electrode 130 and the second gate electrode 131 may be regarded as input terminals, and the first electrode 120 may be regarded as an output terminal. A low-potential voltage may be input to the second electrode 121. The second electrode 121 to which the low-potential voltage is applied may be a source electrode of the first transistor. A high-potential voltage may be input to the third electrode 122. The third electrode 122 to which the high-potential voltage is applied may be a source electrode of the second transistor. The first electrode 120 through which the output is generated may be a drain electrode of the first transistor, and may be a drain electrode of the second transistor. However, without being limited thereto, an input signal may be input to the first gate electrode 130 and the second gate electrode 131, and an output may be generated through the second electrode 121 and the third electrode 122.

Upon application of the low voltage to the first gate electrode 130 and the second gate electrode 131, the first transistor may be turned off and the second transistor may be turned on, such that current may flow from the third electrode 122 to the first electrode 120 and thus the input signal may be low and an output signal may be high. Upon application of the high voltage to the first gate electrode 130 and the second gate electrode 131, the first transistor may be turned on and the second transistor may be turned off, such that current may flow from the first electrode 120 to the second electrode 121 and thus the input signal may be high and an output signal may be low. Thus, the semiconductor device may operate as an inverter that inverts '0' into '1' and '1' into '0'.

The first gate electrode 130 and the second gate electrode 131 may be sequentially stacked on the first 2D material layer 110. The first gate electrode 130 and the second gate electrode 131 may be integrated into one gate electrode. Each of the first gate electrode 130 and the second gate electrode 131 may include metal, conductive polysilicon, conductive metal nitride, or a combination thereof. The metal may include at least one metal selected from Ti, Ta, W, Mo, Au, Cu, Al, Ni, Co, Ru, Nb, La, Mg, Sr, or Hf, and the conductive metal nitride may include a titanium nitride (TiN), a tantalum nitride (TaN), or a combination thereof.

The first insulating layer 140 may serve as a gate insulating film of the first transistor between the first gate electrode 130 and the first 2D material layer 110, and the second insulating layer 141 may serve as a gate insulating film of the second transistor between the second gate electrode 131 and the second 2D material layer 111. Each of the first insulating layer 140 and the second insulating layer 141 may include a silicon oxide film, a silicon nitride film, a silicon oxynitride film, a high-dielectric film, or a combination thereof. The high-dielectric film may include a metal oxide having a higher dielectric constant than that of a silicon oxide film. For example, the high-dielectric film may include a hafnium oxide, a hafnium oxynitride, or a hafnium silicon oxide, but may not be limited to the above-listed materials.

Figure 2:
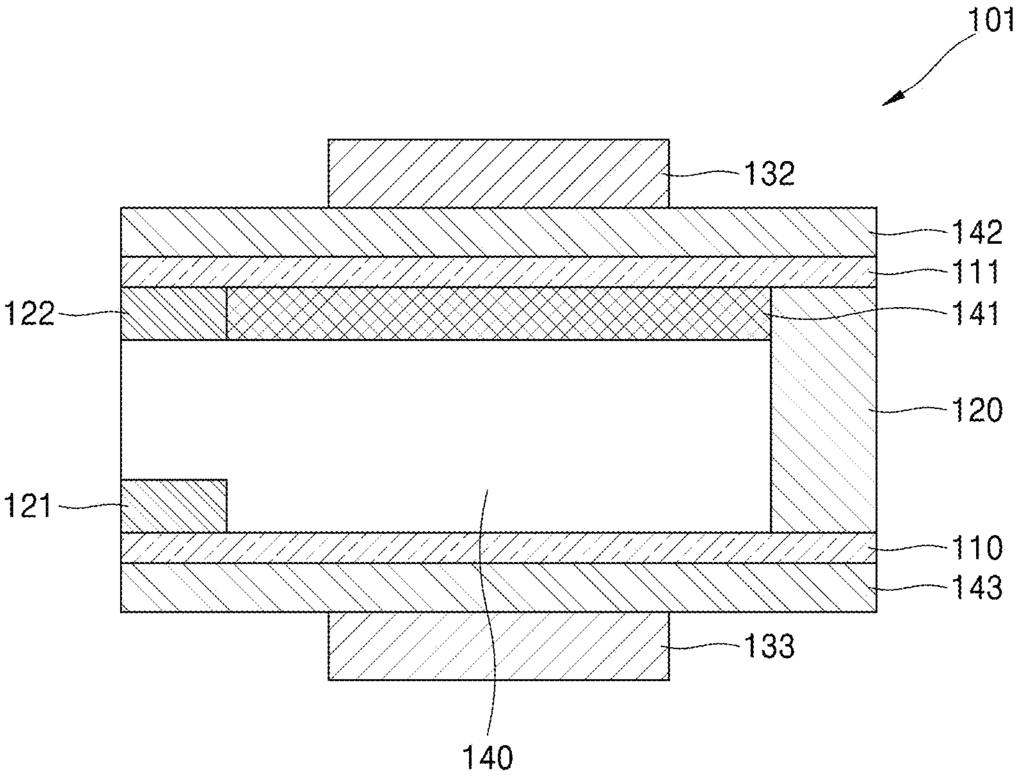

FIG. 2 is a cross-sectional view showing a semiconductor device according to an embodiment.

Referring to FIG. 2, a semiconductor device 101 may include the first 2D material layer 110, the first electrode 120 arranged on the right side (e.g., end region) of the first 2D material layer 110, the second electrode 121 arranged on the left side (e.g., end region) of the first 2D material layer 110, the first insulating layer 140 arranged on the first 2D material layer 110, a third electrode 122 arranged on the second electrode 121, the second 2D material layer 111 arranged on the first electrode 120 and the third electrode 122, a second insulating layer 141 arranged under the second 2D material layer 111, a third insulating layer 142 arranged on the second 2D material layer 111, a third gate electrode 132 arranged on the third insulating layer 142, a fourth insulating layer 143 arranged under the first 2D material layer 110, and a fourth gate electrode 133 arranged under the fourth insulating layer 143.

The first electrode 120 may be electrically connected to the first 2D material layer 110 and the second 2D material layer 111. The second electrode 121 may be arranged on a top surface of the first 2D material layer 110 and may be electrically connected to the first 2D material layer 110. The third electrode 122 may be arranged on a bottom surface of the second 2D material layer 111 and may be electrically connected to the second 2D material layer 111. The first insulating layer 140 may be filled between the first 2D material layer 110 and the second insulating layer 141 and may be filled between the second electrode 121 and the third electrode 122. The second insulating layer 141 may be filled between the first insulating layer 140 and the second 2D material layer 111.

The semiconductor device 101 may be the same as the semiconductor device 100 of FIG. 1 except for including the third gate electrode 132 and the fourth gate electrode 133 instead of the first gate electrode 130 and the second gate electrode 131. In a description of FIG. 2, a matter overlapping that of FIG. 1 will be omitted. In the semiconductor device 101 requiring two input electrodes, the gate electrode may be separated into an upper portion and a lower portion and may be arranged as shown in FIG. 2.

Each of the third gate electrode 132 and the fourth gate electrode 133 may include metal, conductive polysilicon, conductive metal nitride, or a combination thereof. The metal may include at least one metal selected from Ti, Ta, W, Mo, Au, Cu, Al, Ni, Co, Ru, Nb, La, Mg, Sr, or Hf, and the conductive metal nitride may include TiN, TaN, or a combination thereof.

The third insulating layer 142 may serve as a gate insulating film of the second transistor between the third gate electrode 132 and the second 2D material layer 111, and the fourth insulating layer 143 may serve as a gate insulating film of the first transistor between the fourth gate electrode 133 and the first 2D material layer 110. Each of the third insulating layer 142 and the fourth insulating layer 143 may include a silicon oxide film, a silicon nitride film, a silicon oxynitride film, a high-dielectric film, or a combination thereof. The high-dielectric film may include a metal oxide having a higher dielectric constant than that of a silicon oxide film. For example, the high-dielectric film may include a hafnium oxide, a hafnium oxynitride, or a hafnium silicon oxide, but may not be limited to the above-listed materials.

Figure 3:
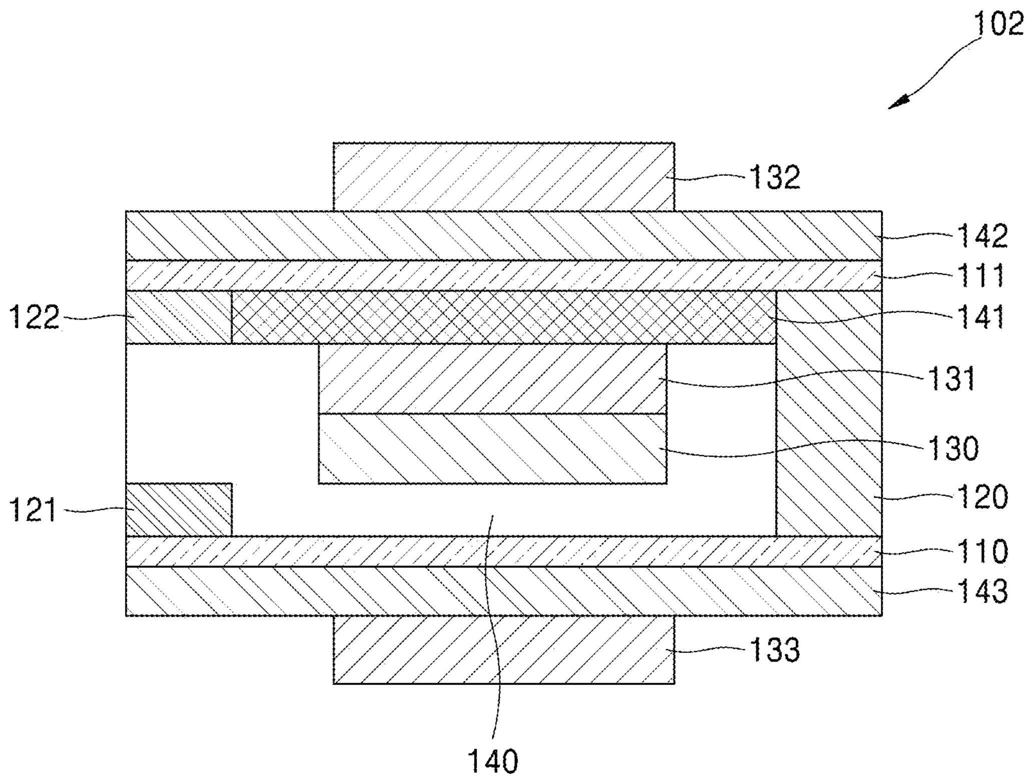

FIG. 3 is a cross-sectional view showing a semiconductor device according to an embodiment.

Referring to FIG. 3, a semiconductor device 102 may include the first 2D material layer 110, the first electrode 120 arranged on the right side (e.g., end region) of the first 2D material layer 110, the second electrode 121 arranged on the left side (e.g., end region) of the first 2D material layer 110, the first insulating layer 140 arranged on the first 2D material layer 110, the first gate electrode 130 and the second gate electrode 131 arranged on the first 2D material layer 110 between the first electrode 120 and the second electrode 121, the second insulating layer 141 arranged on the second gate electrode 131, the third electrode 122 arranged on the second electrode 121, the second 2D material layer 111 arranged on the first electrode 120 and the third electrode 122, and the fourth gate electrode 133 arranged under the first 2D material layer 110.

The first electrode 120 may be electrically connected to the first 2D material layer 110 and the second 2D material layer 111. The second electrode 121 may be arranged on a top surface of the first 2D material layer 110 and may be electrically connected to the first 2D material layer 110. The third electrode 122 may be arranged on a bottom surface of the second 2D material layer 111 and may be electrically connected to the second 2D material layer 111. The first insulating layer 140 may be filled between the first 2D material layer 110 and the second insulating layer 141 and may be filled between the second electrode 121 and the third electrode 122. The second insulating layer 141 may be filled between the first insulating layer 140 and the second 2D material layer 111.

The semiconductor device 102 may be the same as the semiconductor device 100 of FIG. 1 except for further including the third gate electrode 132 and the fourth gate electrode 133. In a description of FIG. 3, a matter overlapping that of FIG. 1 will be omitted.

Each of the third gate electrode 132 and the fourth gate electrode 133 may include metal, conductive polysilicon, conductive metal nitride, or a combination thereof. The metal may include at least one metal selected from Ti, Ta, W, Mo, Au, Cu, Al, Ni, Co, Ru, Nb, La, Mg, Sr, or Hf, and the conductive metal nitride may include TiN, TaN, or a combination thereof.

The semiconductor device 102 may include the third gate electrode 132 and the fourth gate electrode 133, and the same voltage may be simultaneously applied to the first gate electrode 130, the second gate electrode 131, the third gate electrode 132, and the fourth gate electrode 133, such that the semiconductor device 102 may have a gate all around (GAA) structure. In this way, in spite of device size reduction, a channel effect may be greatly improved and an operating voltage may be lowered.

Figure 4:
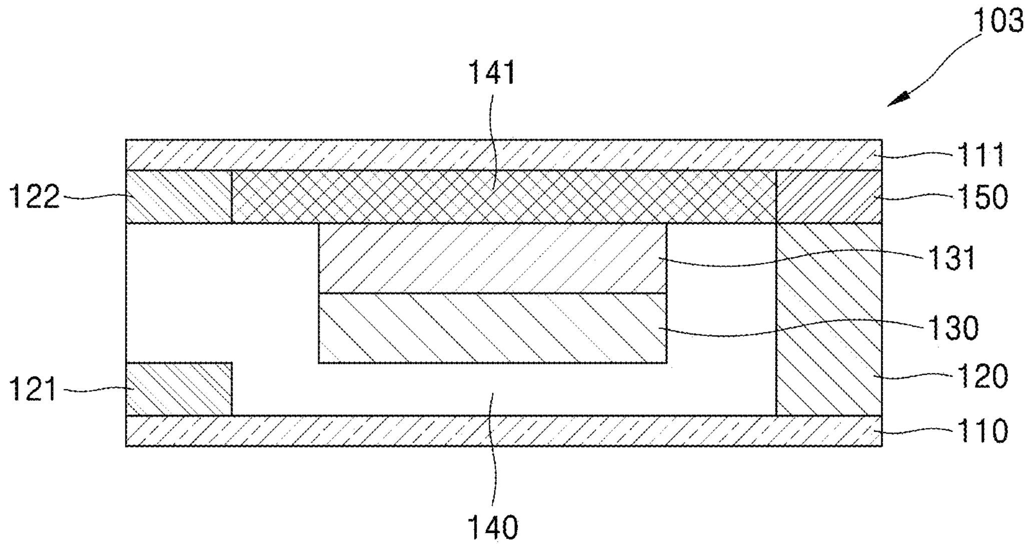

FIG. 4 is a cross-sectional view showing a semiconductor device according to an embodiment.

Referring to FIG. 4, a semiconductor device 103 may include the first 2D material layer 110, the first electrode 120 arranged on the right side (e.g., end region) of the first 2D material layer 110, the second electrode 121 arranged on the left side (e.g., end region) of the first 2D material layer 110, the first insulating layer 140 arranged on the first 2D material layer 110, the first gate electrode 130 and the second gate electrode 131 arranged on the first insulating layer 140, the second insulating layer 141 arranged on the second gate electrode 131, the third electrode 122 arranged on a left side (e.g., end region) of the second insulating layer 141, the second 2D material layer 111 arranged on the first electrode 120 and the third electrode 122, and an intermediate layer 150 arranged between the first electrode 120 and the second 2D material layer 111. The semiconductor device 103 may be the same as the semiconductor device 100 of FIG. 1 except for further including the intermediate layer 150. In a description of FIG. 4, a matter overlapping that of FIG. 1 will be omitted.

The intermediate layer 150 may include amorphous carbon, graphene, or hexagonal boron nitride (h-BN). A thickness of the intermediate layer 150 may be about 1 nm or less. By arranging the intermediate layer 150 of a semi-metal property between the second 2D material layer 111 and the first electrode 120 including a metal material, Fermi-level depinning of the second 2D material layer 111 may be caused. Thus, a contact resistance of the second 2D material layer 111 may be reduced and the second 2D material layer 111 may be formed by being directly grown on the intermediate layer 150.

The above-described semiconductor devices 100, 101, 102, and 103 may be applied to a memory device, for example, a dynamic random access memory (DRAM) device, etc. The memory device may have a structure in which the above-described semiconductor devices 100, 101, 102, and 103 and a capacitor are electrically connected. The semiconductor devices 100, 101, 102, and 103 may be applied to various electronic devices. For example, the above-described semiconductor devices 100, 101 102, and 103 may be used for arithmetic operations, program execution, temporary data retaining, etc., in an electronic device such as a mobile device, a computer, a laptop computer, a sensor, a network device, a neuromorphic device, etc.

FIGS. 5A to 5J are cross-sectional views showing a part of a process of fabricating the semiconductor device shown in FIG. 3, according to an embodiment.

Figure 5A:
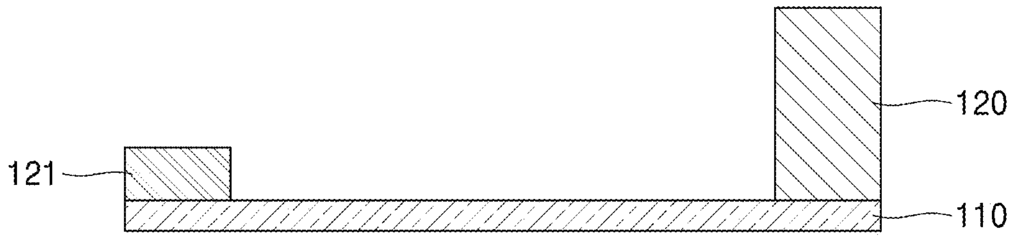
FIGS. 5A to 5J are cross-sectional views showing a part of a process of fabricating a semiconductor device shown in FIG. 3, according to an embodiment.

Referring to FIG. 5A, after the first 2D material layer 110 is formed, the first electrode 120 and the second electrode 121 may be formed on both sides (e.g., end regions) of the first 2D material layer 110. The first electrode 120 and the second electrode 121 may be formed by deposition using physical vapor deposition (PVD). In this process, a defect may occur in the first 2D material layer 110 and a chemical contact may be formed between the first 2D material layer 110 and the first electrode 120. For example, the first electrode 120 and the second electrode 121 may be deposited by sputtering or evaporation. The first electrode 120 and the second electrode 121 may include the same material. The first electrode 120 may serve as a via and a contact at the same time, thereby simplifying a fabricating process.

Figure 5B:
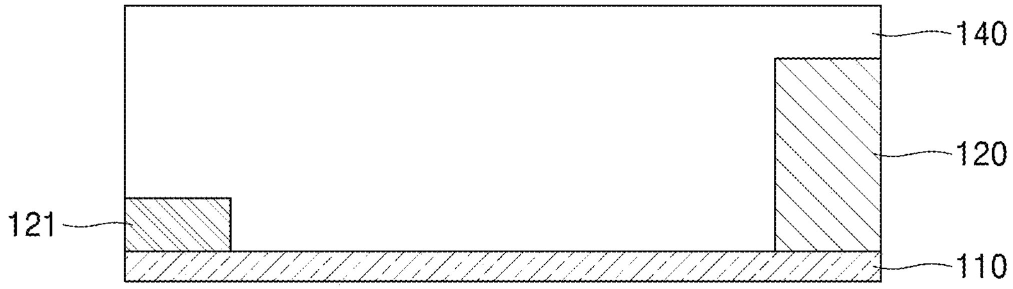

Referring to FIG. 5B, the first insulating layer 140 covering the first 2D material layer 110, the first electrode 120, and the second electrode 121 may be formed. The first insulating layer 140 may be formed by deposition using atomic later deposition (ALD) or chemical vapor deposition (CVD). The first insulating layer 140 may include a silicon oxide film, a silicon nitride film, a silicon oxynitride film, a high-dielectric film, or a combination thereof. The high-dielectric film may include a metal oxide having a higher dielectric constant than that of a silicon oxide film.

Figure 5C:
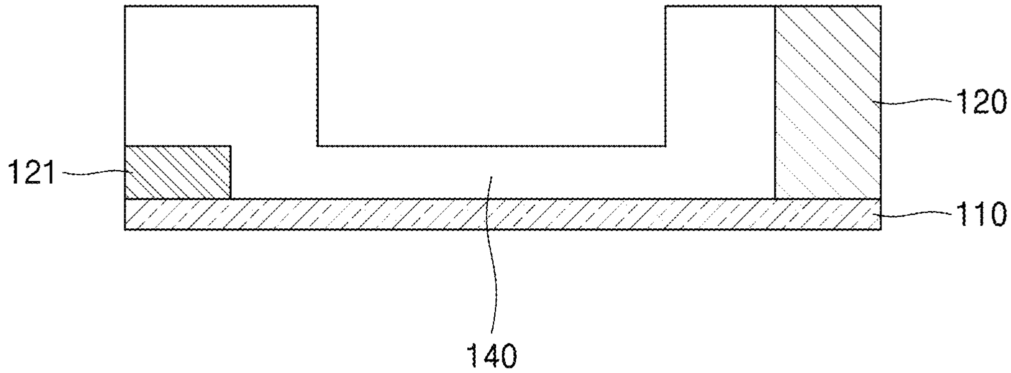

Referring to FIG. 5C, the first insulating layer 140 may be etched. The first electrode 120 may be selectively opened by wet etching or a space where a gate electrode is to be arranged may be formed.

Figure 5D:
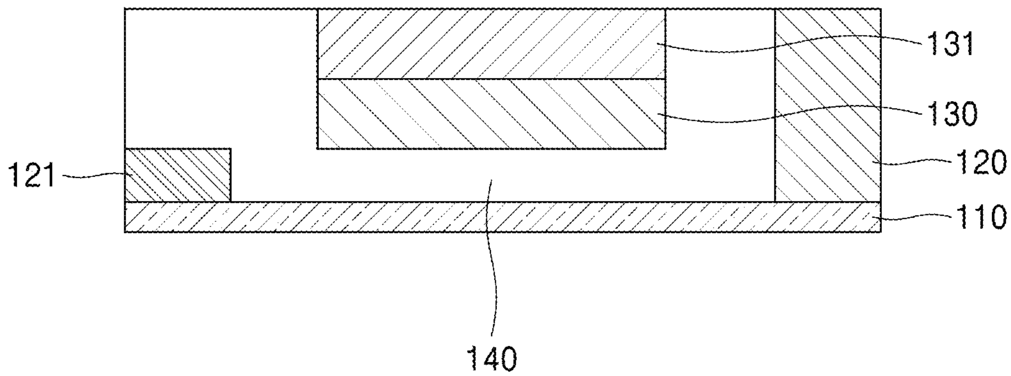

Referring to FIG. 5D, the first gate electrode 130 and the second gate electrode 131 may be formed on the etched first insulating layer 140. Each of the first gate electrode 130 and the second gate electrode 131 may include metal, conductive polysilicon, conductive metal nitride, or a combination thereof.

Figure 5E:
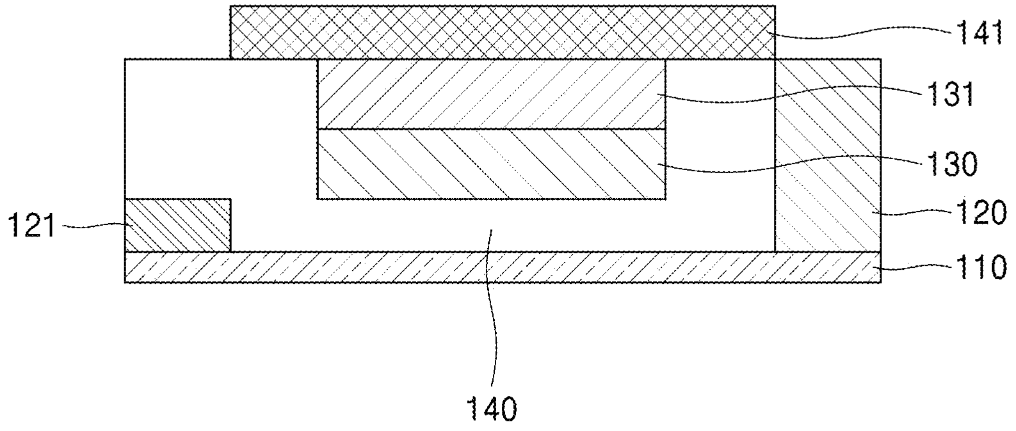

Referring to FIG. 5E, the second insulating layer 141 may be formed on the second gate electrode 131. The second insulating layer 141 may include a silicon oxide film, a silicon nitride film, a silicon oxynitride film, a high-dielectric film, or a combination thereof. The high-dielectric film may include a metal oxide having a higher dielectric constant than that of a silicon oxide film.

Figure 5F:
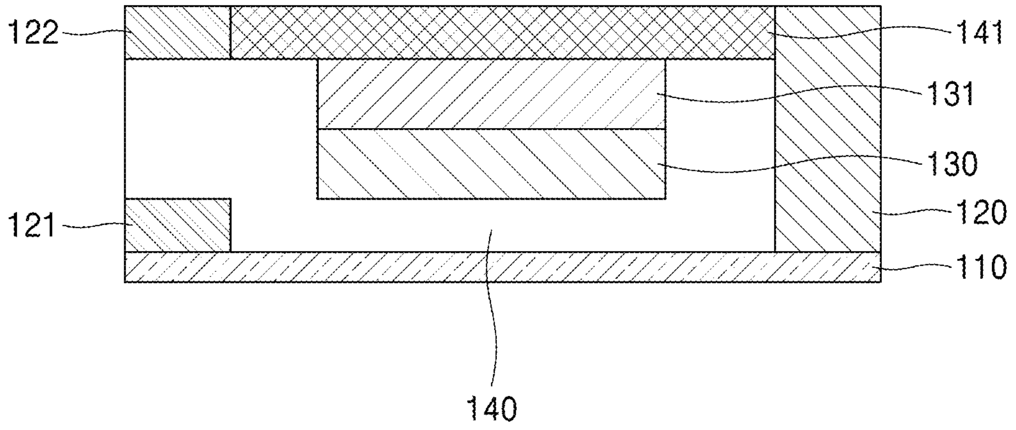

Referring to FIG. 5F, the third electrode 122 may be formed on the left side (e.g., end region) of the second insulating layer 141, and the first electrode 120 may extend upward by a height of the second insulating layer 141 on the right side (e.g., end region) of the second insulating layer 141. The first electrode 120 and the third electrode 122 may include the same material. Thereafter, a surface may be planarized by a chemical mechanical polishing (CMP) process.

Figure 5G:
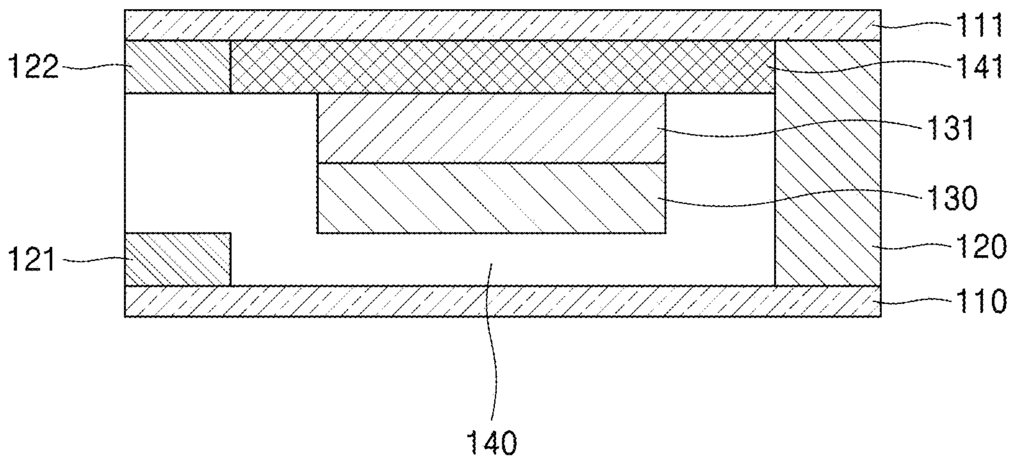

Referring to FIG. 5G, the second 2D material layer 111 may be formed on a planarized electrode. The second 2D material layer 111 may be formed on the first electrode 120 by a transfer process. A physical contact may be formed between the second 2D material layer 111 and the first electrode 120.

Figure 5H:
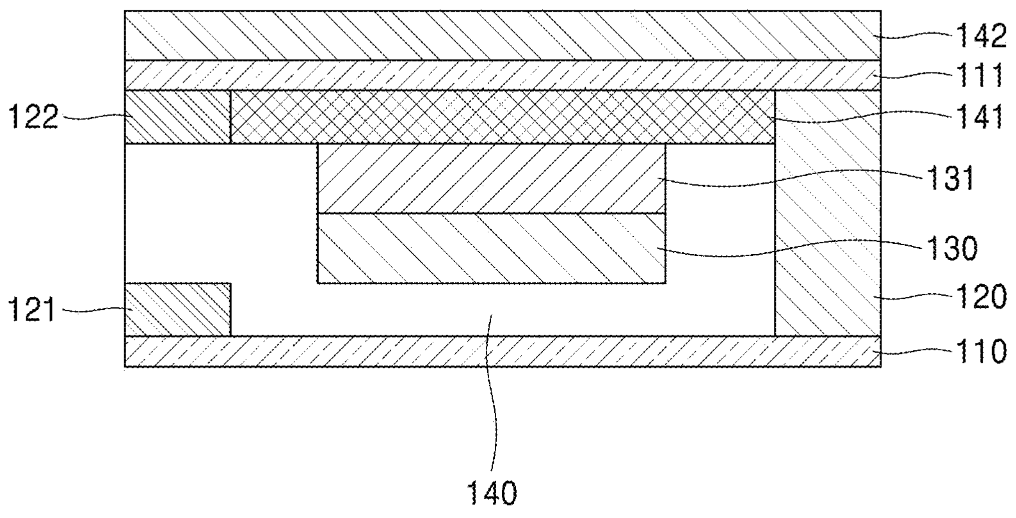

Referring to FIG. 5H, the third insulating layer 142 may be formed on the second 2D material layer 111. The third insulating layer 142 may include a silicon oxide film, a silicon nitride film, a silicon oxynitride film, a high-dielectric film, or a combination thereof. The high-dielectric film may include a metal oxide having a higher dielectric constant than that of a silicon oxide film.

Figure 5I:
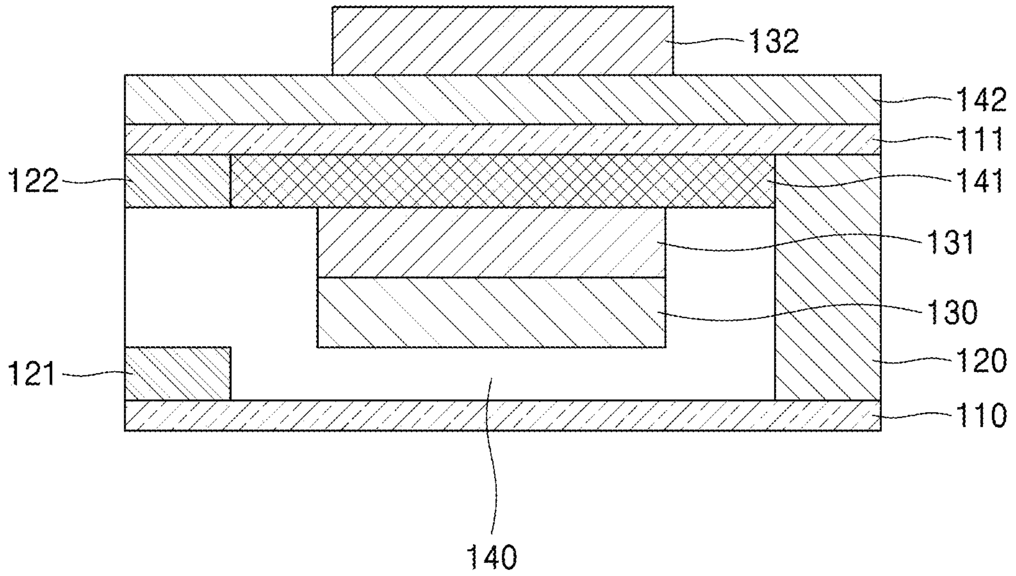

Referring to FIG. 5I, the third gate electrode 132 may be formed on the third insulating layer 142. The third gate electrode 132 may include metal, conductive polysilicon, a conductive metal nitride, or a combination thereof.

Figure 5J:
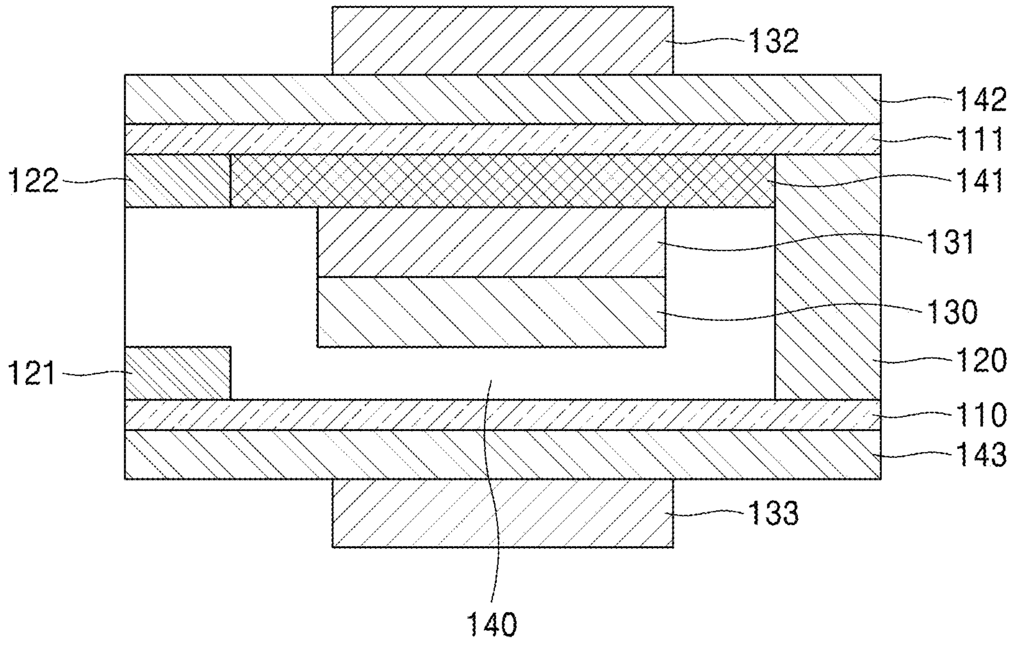

Referring to FIG. 5J, the fourth insulating layer 143 may be formed under the first 2D material layer 110. The fourth insulating layer 143 may include a silicon oxide film, a silicon nitride film, a silicon oxynitride film, a high-dielectric film, or a combination thereof. The high-dielectric film may include a metal oxide having a higher dielectric constant than that of a silicon oxide film. The fourth gate electrode 133 may be formed under the fourth insulating layer 143. The fourth gate electrode 133 may include metal, conductive polysilicon, a conductive metal nitride, or a combination thereof.

Figure 6A:
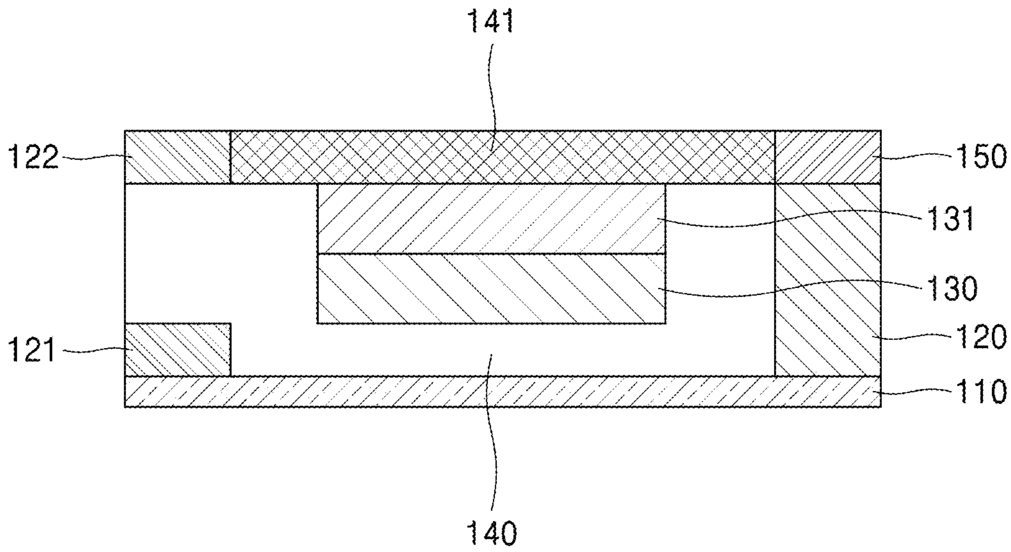
FIGS. 6A to 6C are cross-sectional views showing a part of a process of fabricating a semiconductor device shown in FIG. 4, according to an embodiment.
Figure 6B:
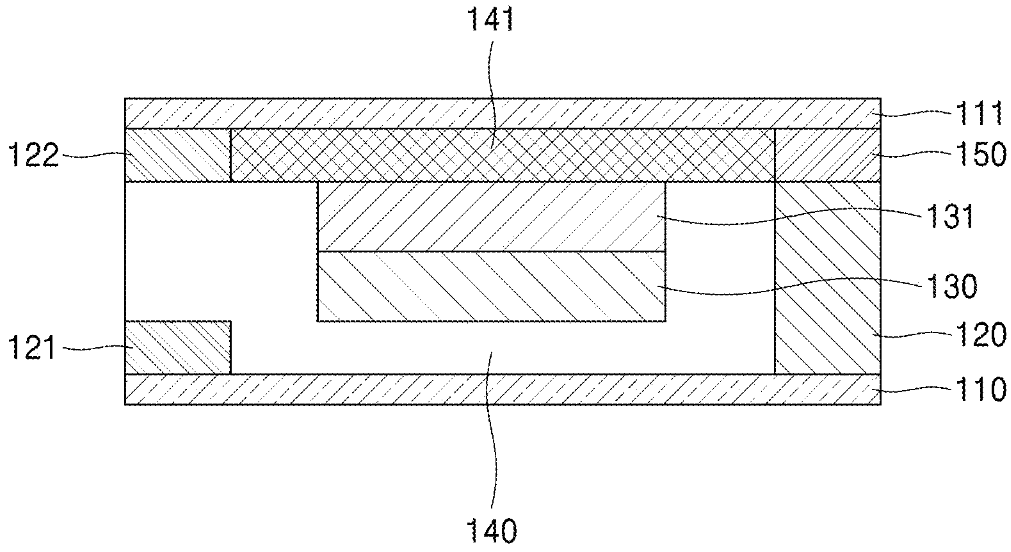
Figure 6C:
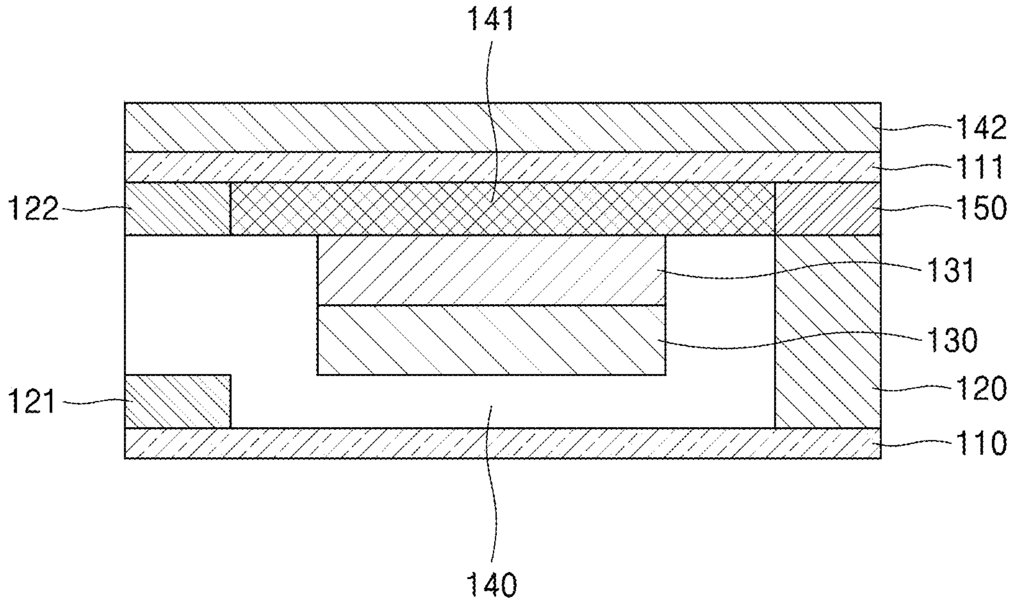

FIGS. 6A to 6C are cross-sectional views showing a part of a process of fabricating the semiconductor device shown in FIG. 4, according to an embodiment.

In another embodiment, operations of FIGS. 5F to 5H may be replaced with operations of FIGS. 6A to 6C.

Referring to FIG. 6A, the third electrode 122 may be formed on the left side (e.g., end region) of the second insulating layer 141, and the intermediate layer 150 may be formed on the first electrode 120. The third electrode 122 may be formed of the same material as the first electrode 120. The intermediate layer 150 may include amorphous carbon, graphene, or h-BN. A thickness of the intermediate layer 150 may be about 1 nm or less. After the intermediate layer 150 is formed, a surface may be planarized by a CMP process.

Referring to FIG. 6B, the second 2D material layer 111 may be formed on the planarized third electrode 122 and intermediate layer 150. The second 2D material layer 111 may be formed by being directly grown on the intermediate layer 150.

Referring to FIG. 6C, the third insulating layer 142 may be formed on the second 2D material layer 111. The third insulating layer 142 may include a silicon oxide film, a silicon nitride film, a silicon oxynitride film, a high-dielectric film, or a combination thereof. The high-dielectric film may include a metal oxide having a higher dielectric constant than that of a silicon oxide film.

Figure 7:
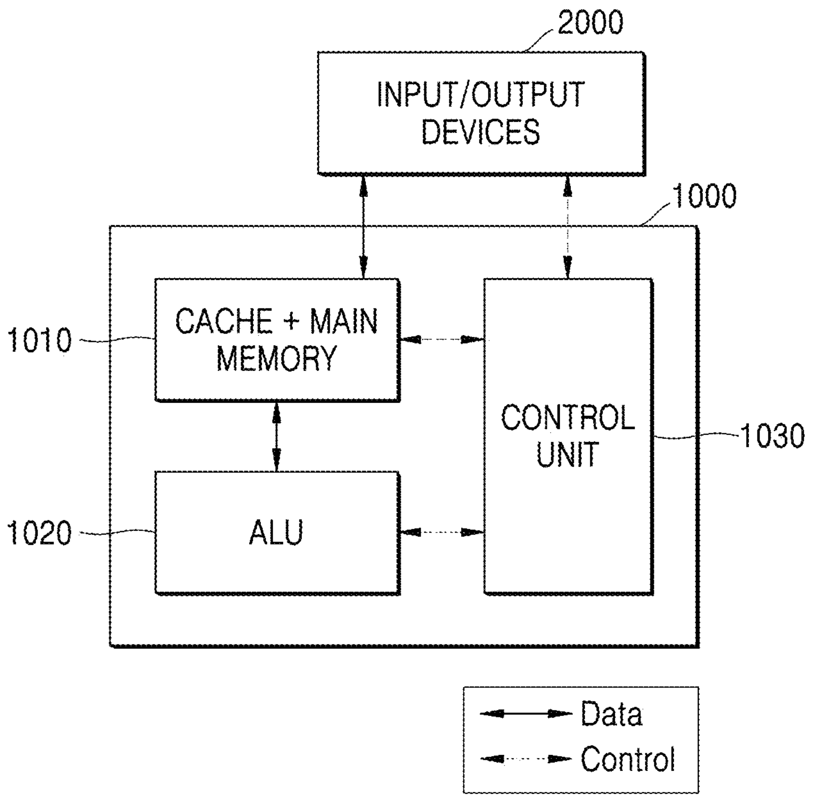
FIGS. 7 and 8 are conceptual views schematically showing an electronic device architecture applicable to an electronic device according to an embodiment.
Figure 8:
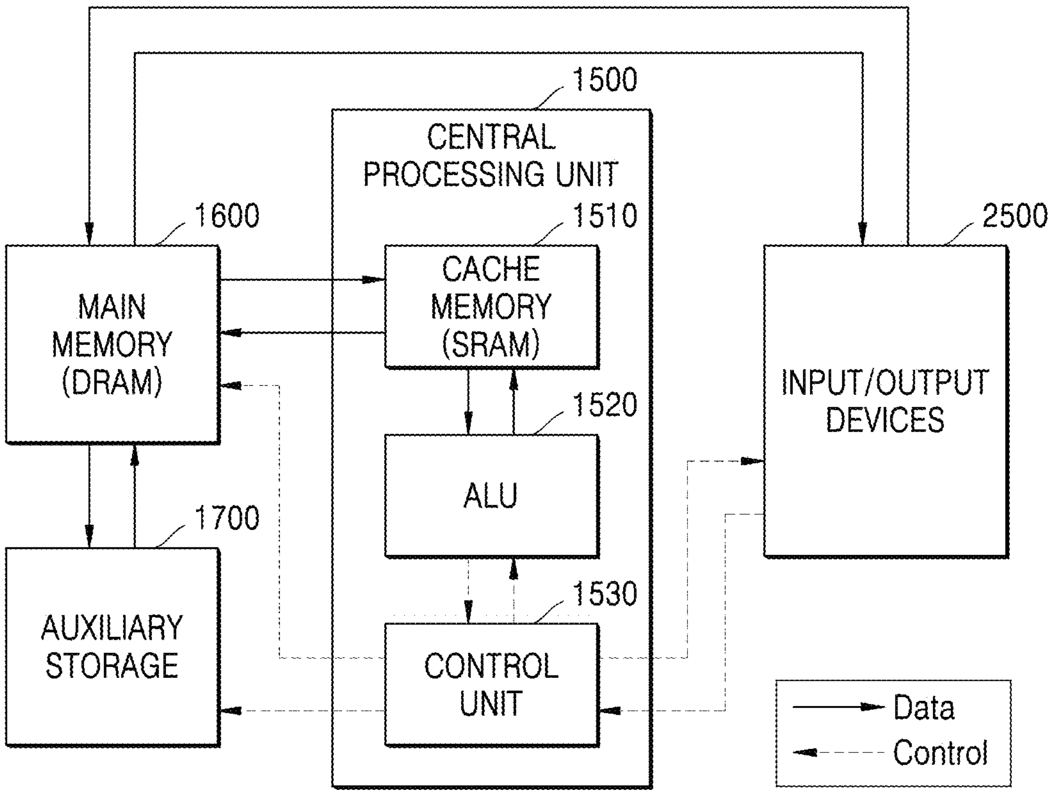

FIGS. 7 and 8 are conceptual views schematically showing an electronic device architecture applicable to an electronic device according to an embodiment.

Referring to FIG. 7, an electronic device architecture 1000 may include a memory unit 1010, an arithmetic logic unit (ALU) 1020, and a control unit 1030. The memory unit 1010, the ALU 1020, and the control unit 1030 may be electrically connected to one another. For example, the electronic device architecture 1000 may be implemented as one chip including the memory unit 1010, the ALU 1020, and the control unit 1030.

More specifically, the memory unit 1010, the ALU 1020, and the control unit 1030 may communicate directly by being connected to one another through a metal line on-chip. The memory unit 1010, the ALU 1020, and the control unit 1030 may be monolithically integrated on one substrate to form one chip. An input/output device 2000 may be connected to the electronic device architecture (chip) 1000.

Each of the ALU 1020 and the control unit 1030 may independently include the above-described semiconductor devices 100, 101, 102, and 103, and the memory unit 1010 may include any one of the semiconductor devices 100, 101, 102, and 103, a capacitor, or a combination thereof. The memory unit 1010 may include both a main memory and a cache memory. The electronic device architecture (chip) 1000 may be an on-chip memory processing unit.

Referring to FIG. 8, a cache memory 1510, an ALU 1520, and a control unit 1530 may constitute a central processing unit (CPU) 1500. The cache memory 1510 may include a static random access memory (SRAM) and may include the above-described semiconductor devices 100, 101, 102, and 103. The cache memory 1510 may include a main memory 1600 and an auxiliary storage 1700 in addition to the CPU 1500. The main memory 1600 may include a DRAM device.

Depending on a circumstance, the electronic device architecture may be implemented in a form where computing-unit devices and memory-unit devices are adjacent to each other in one chip, without distinction of sub-units.

While the semiconductor device including the 2D material and the method of fabricating the same have been described with reference to the embodiments described in the drawings, it will be understood by those of ordinary skill in the art that various modifications and equivalent other embodiments are possible therefrom. Therefore, the disclosed embodiments should be considered in a descriptive sense rather than a restrictive sense. The scope of the present specification is not described above, but in the claims, and all the differences in a range equivalent thereto should be interpreted as being included.

The semiconductor device according to a disclosed embodiment may form different types of contacts on an interfacial surface with a 2D material layer with a single metal by using Fermi-level pinning/depinning.

In the semiconductor device according to a disclosed embodiment, an intermediate layer may be arranged between a second 2D material layer forming a channel layer and a first electrode including a metal material to form the second 2D material layer through a transfer process, thereby making it easy to achieve Fermi-level depinning.

A method of fabricating a semiconductor device according to a disclosed embodiment may form different types of contacts on an interfacial surface with a 2D material layer with single metal and form a first electrode, a second electrode, and a third electrode with the same material, thereby simplifying a process.

It should be understood that embodiments described herein should be considered in a descriptive sense only and not for purposes of limitation. Descriptions of features or aspects within each embodiment should typically be considered as available for other similar features or aspects in other embodiments.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:

a first two-dimensional (2D) material layer comprising a first surface;

a second 2D material layer comprising a second surface facing the first surface of the first 2D material layer;

a first electrode electrically connected between a first end region on the first surface of the first 2D material layer and a first end region on the second surface of the second 2D material layer;

a second electrode on a second end region on the first surface of the first 2D material layer;

a first gate electrode and a second gate electrode between the first 2D material layer and the second 2D material layer, the first gate electrode and the second gate electrode being between the first electrode and the second electrode; and a third electrode on a second end region on the second surface of the second 2D material layer;

a third insulating layer on the second 2D material layer;

a third gate electrode on the third insulating layer;

a fourth insulating layer under the first 2D material layer; and a fourth gate electrode arranged under the fourth insulating layer, wherein a Fermi-level is pinned on an interfacial surface between the first 2D material layer and the first electrode, and the Fermi-level is depinned on an interfacial surface between the second 2D material layer and the first electrode.

2. The semiconductor device of claim 1, wherein the interfacial surface between the first 2D material layer and the first electrode comprises a contact of an n-type polarity, and the interfacial surface between the second 2D material layer and the first electrode comprises a contact of a p-type polarity.

3. The semiconductor device of claim 1, wherein the first 2D material layer comprises $MoS_2$ or $WS_2$.

4. The semiconductor device of claim 1, wherein the second 2D material layer comprises $WSe_2$.

5. The semiconductor device of claim 1, wherein the first 2D material layer and the second 2D material layer comprise $MoTe_2$.

6. The semiconductor device of claim 1, further comprising:

a first insulating layer on the first 2D material layer; and a second insulating layer on the second gate electrode.

7. The semiconductor device of claim 1, further comprising:

an intermediate layer between the first electrode and the second 2D material layer.

8. The semiconductor device of claim 7, wherein the intermediate layer comprises amorphous carbon, graphene, or hexagonal boron nitride (h-BN).

9. The semiconductor device of claim 7, wherein a thickness of the intermediate layer is less than or equal to about 1 nm.

10. The semiconductor device of claim 1, wherein the first electrode, the second electrode, and the third electrode comprise an identical material.

11. The semiconductor device of claim 1, wherein the first electrode comprises a source electrode, the second electrode and the third electrode each comprise a drain electrode, the second electrode and the third electrode are spaced apart from each other in a first direction, the first electrode is spaced apart from the second electrode and the third electrode in a second direction, and the first direction crosses the second direction.

12. An electronic device comprising:

processing circuitry; and the semiconductor device according to claim 1.

* * * * *